(12) United States Patent
Kawano et al.

(10) Patent No.: US 10,509,080 B2
(45) Date of Patent: Dec. 17, 2019

(54) DIFFERENTIAL TYPE MAGNETIC SENSOR

(71) Applicant: AICHI STEEL CORPORATION, Tokai-shi (JP)

(72) Inventors: Takeshi Kawano, Tokai (JP); Hitoshi Aoyama, Tokai (JP); Michiharu Yamamoto, Tokai (JP); Hideo Arakawa, Tokai (JP)

(73) Assignee: AICHI STEEL CORPORATION, Tokai-shi (JP)

( * ) Notice: Subject to any disclaimer, the term of this patent is extended or adjusted under 35 U.S.C. 154(b) by 35 days.

(21) Appl. No.: 15/561,744

(22) PCT Filed: Feb. 23, 2016

(86) PCT No.: PCT/JP2016/055247
§ 371 (c)(1),
(2) Date: Sep. 26, 2017

(87) PCT Pub. No.: WO2016/158096
PCT Pub. Date: Oct. 6, 2016

(65) Prior Publication Data
US 2018/0106872 A1 Apr. 19, 2018

(30) Foreign Application Priority Data
Mar. 27, 2015 (JP) .................. 2015-066524

(51) Int. Cl.
*G01R 33/06* (2006.01)
*H01L 43/02* (2006.01)

(52) U.S. Cl.
CPC .............. *G01R 33/06* (2013.01); *H01L 43/02* (2013.01)

(58) Field of Classification Search
CPC ...... G01R 1/30; G01R 33/00; G01R 33/0017; G01R 33/02; G01R 33/028; G01R 33/06;
(Continued)

(56) References Cited

U.S. PATENT DOCUMENTS 2,260,589 A * 10/1941 Smith ................. G01R 33/09
324/252
6,123,902 A * 9/2000 Koch ............... G01N 33/54333
209/223.1
(Continued)

FOREIGN PATENT DOCUMENTS

JP         59-202057 A     11/1984
JP       H04-296627 A     10/1992
(Continued)

OTHER PUBLICATIONS

Machine translation for JP, 2000-098009 (Year: 2000).*
(Continued)

*Primary Examiner* — Steven L Yeninas
(74) *Attorney, Agent, or Firm* — Oblon, McClelland, Maier & Neustadt, L.L.P.

(57) ABSTRACT

(Subject)
To provide a differential magnetic sensor capable of accurate magnetic detection of a local weak magnetic field even when there is a difference in detection sensitivity of a plurality of magnetic sensors used as a differential type magnetic sensor.
(Means for solving)
The differential type magnetic sensor comprises a driving circuit 2 for outputting driving currents, two magnetic detecting means E10, E20 including two magneto-impedance elements comprising two magneto-sensitive bodies which are disposed at two distant points and wherein the magnetic field signal voltages are generated in response to two external magnetic fields intensities around the two magneto-sensitive bodies to which the driving currents are applied and a differential operating means 5 for operating a difference signal voltage between the two magnetic field signal voltages output from the magnetic detecting means and for outputting the difference signal voltage between the two external magnetic field intensities, and further com-
(Continued)

▼: Predetermined direct-current potential prises a signal adjusting means which is interposed between the driving circuit 2 and the differential operating means and adjust the two magnetic field signal voltages output based on the two magneto-sensitive bodies having different detection sensitivities such that the detection sensitivities of the two magnetic detection means are considered to be roughly the same as each other.

3 Claims, 10 Drawing Sheets

(58) Field of Classification Search
CPC .............. G01R 33/063; G01R 33/1215; G01R 33/1269; G01R 33/1276; G01R 33/0023; G01R 15/207; H01L 43/02; G01N 35/0098
USPC ................ 324/252, 260, 244, 249, 251, 262
See application file for complete search history.

(56) References Cited

U.S. PATENT DOCUMENTS

| | | | | |
|---|---|---|---|---|
| 6,229,307 | B1 * | 5/2001 | Umehara | ............... G01R 33/02 |
| | | | | 324/244 |
| 7,038,447 | B2 * | 5/2006 | Motz | ..................... G01D 3/036 |
| | | | | 324/249 |
| 7,259,546 | B1 * | 8/2007 | Hastings | .............. G01R 15/202 |
| | | | | 324/117 H |
| 2012/0249126 | A1 | 10/2012 | Friedrich et al. | |
| 2012/0326716 | A1 * | 12/2012 | Kawase | ................. G01R 33/02 |
| | | | | 324/263 |
| 2014/0347040 | A1 * | 11/2014 | Kawase | ................. G01D 5/145 |
| | | | | 324/207.12 |

FOREIGN PATENT DOCUMENTS

| | | |
|---|---|---|
| JP | H09-80132 A | 3/1997 |
| JP | 11-52036 A | 2/1999 |
| JP | 2000-98009 A | 4/2000 |
| JP | 2004-301545 A | 10/2004 |
| JP | 2014-190774 A | 10/2014 |

OTHER PUBLICATIONS

Japanese Office Action dated Jan. 31, 2018 in Japanese Patent Application No. 2015-066524 (with English translation).
Extended European Search Report dated Nov. 2, 2018 in European Patent Application No. 16771980.6, 11 pages.
International Search Report dated May 17, 2016, In PCT/JP2016/055247 filed Feb. 23, 2016.
Transistor Technology Special No. 17, Basic Application Technique for Applying Differential Amplifier and Technique of Electrical Circuit for Composing Differential Amplifier are Disclosed, 4 pages.

* cited by examiner

PRIOR ART

☐ : Predetermined direct-current potential

▽ : Predetermined direct-current potential

▽: Predetermined direct-current potential

DIFFERENTIAL TYPE MAGNETIC SENSOR

TECHNICAL FIELD OF THE INVENTION

The present invention relates to a magnetic sensor in which background magnetic field components common to two points are deleted by two magneto-impedance sensors disposed at two distant points and in which one of the magneto-impedance sensors allows the detection of a local weak magnetic field.

PRIOR ART

In recent years, needs for measuring a significantly weak magnetic field of iron powder or the like in the field of physicochemical research have been increasing, and thus needs for a high-sensitivity differential type magnetic sensor which can measure a local weak magnetic field by measuring a difference between magnetic fields at two different points with nigh sensitivity have been increasing.

Here, the differential type magnetic sensor means a type of magnetic sensor in which two magnetic detecting means formed with two magneto-impedance sensors are used, one of the magnetic sensors is brought close to a measurement target such as iron powder, the other magnetic sensor is arranged in a position away from the measurement target such as iron powder, a difference between the magnetic field signals of the magnetic sensors at the individual points is operated so as to delete background magnetic field components common to the two points, that is, background noise components (such as geomagnetism), so as to make it possible to extract a local weak magnetic field such as a magnetic field generated only from the measurement target such as iron powder.

Here, the magneto-impedance sensor uses, as a magneto-sensitive booty, an amorphous wire or a thin film body and thereby can constitute a magneto-impedance element, however, an example where the amorphous wire is used will be mainly described here. That is, in the magneto-impedance sensor, as disclosed in Patent Literature 1, a pulse current or a high-frequency current is supplied to the magneto-sensitive body such as the amorphous wire so as to realize about a magneto-impedance effect in the amorphous wire and an alternating-current voltage in response to the resulting external magnetic field (magnetic field in the surroundings where the amorphous wire is placed) is extracted from both ends of the amorphous wire or of a detection coil wound around the amorphous wire and is output as magnetism or a magnetic field signal voltage with a sample-hold circuit or other signal processing circuit.

In the conventional differential type magnetic sensor described above, as shown in FIG. 1, comprises two magnetic detecting means S1, and S2 which are placed in the environment of magnetic fields H1 and H2 at two points a distance L [m] away from each other and whose detection sensitivities are equal to each other and a differential operating means DA for determining a difference between magnetic field signals obtained from the magnetic detecting means are used, and thus a difference H1–H2 between the magnetic field signals obtained from the two magnetic detecting means is output.

PRIOR ART DOCUMENT

Patent Literature 1: WO2005/019851

SUMMARY OF THE INVENTION

However, for example, the magnetic field of iron powder having a diameter of 0.1 mm is an extremely small magnetic field of about 1 nT whereas a background magnetic field forming a noise cam be several tens of thousands nT in an example of geomagnetism, which is significantly large as compared with a magnetic field to be measured. On the other hand, even a background magnetic field noise produced from a motor, a light fixture or the like in a factory, a work place, a laboratory or the like whose magnetic field level is lower than the above may be several hundred nT or more. Therefore, for example, assuming that a sensitivity difference between the two magnetic detecting means is 1%, the result of a differential operation, that is, residual magnetic field components equivalent to the H1–H2 are left as the background magnetic field equivalent to several nT, and disadvantage occurs where it is impossible to distinguish the background magnetic field from 1 nT of the magnetic field components of the iron powder. In the case of a background magnetic field larger than the above, the influence of a sensitivity difference is further increased. Therefore, in order to accurately extract a weak magnetic field which is present locally as described above, it is necessary to minimize a difference between the detection sensitivities on the two magnetic detecting means as much as possible, to ideally make the detection sensitivities substantially equal to each other, and to accurately make the detection sensitivities equal to each other before the two magnetic signals are input to the differential operating means.

Therefore, although conventionally, a method has been adopted in which the two magnetic detecting means are produced while performing an inline inspection such that the properties thereof are the same as each other or a method is adopted in which a plurality of magnetic detecting means are produced and magnetic detecting means whose properties are same as each other are selected and used. Since above method increases man-hours and time, it is a problem that the production cost is disadvantageously increased.

In order to solve the above problem and thereby make it possible to inexpensively produce a high-sensitivity differential type magnetic sensor, the present inventors focused on a first technical idea of the present invention in which a signal adjusting means is added to the magneto-impedance sensor such that, even when a difference caused by variations in the sensitivity properties of the magneto-impedance elements is present, the difference is adjusted before the detected magnetic field signal voltage is input to the differential operating means such that the detection sensitivities on the two magnetic detecting means can be regarded as equal to each other as much as possible.

Furthermore, the present inventors focused on a second technical idea of the present invention in which a driving current supplied from a driving means is adjusted by the signal adjusting means in response to a difference between the detection sensitivities on the two magneto-impedance sensors whose detection-sensitivities are different, and also focused on a third technical idea of the present invention in which the gains of a signal processing means connected to the two magneto-impedance elements are adjusted by the signal adjusting means.

That is, as described previously, when a local very small magnetic field of iron powder or the like is to be measured with the differential type magnetic sensor, it is necessary to make the detection sensitivities on the two magneto-impedance elements substantially equal to each other. However, in actuality, when it is attempted to provide the magneto-impedance elements whose detection sensitivities are equal to each other, due to variations on the production or the like, there is a case where a difference between the detection sensitivities is produced as a result. In the present invention, even in such a case, the signal adjusting means is provided, and thus the gains of the driving current or the signal processing means are adjusted in response to a difference between the detection sensitivities, with the result that it is possible to accurately measure a local very small magnetic field.

A differential type magnetic sensor on a first aspect described in claim 1 of the present invention comprises a driving means for outputting driving currents, two magnetic detecting means including two magneto-impedance elements comprising two magneto-sensitive bodies which are disposed at two distant points and wherein the magnetic field signal voltages are generated in response to two external magnetic fields intensities around the two magneto-sensitive bodies to which the driving currents are applied and a differential operating means for operating a difference signal voltage between the two magnetic field signal voltages output from the magnetic detecting means and for outputting the difference signal between the two external magnetic field intensities, and further comprises a signal adjusting means which is interposed between the driving means and the differential operating means and adjusts the output signals of the two magnetic detecting means in order that the two magnetic detecting means including the two magneto-impedance elements having different detection sensitivities output the two magnetic field signal voltages of same level in case of same intensities on the two external magnetic field intensities.

The differential type magnetic sensor on a second aspect described in claim 2 of the present invention according to the first aspect of the present invention, comprises the signal adjusting means which is configured to adjust the driving current supplied from the driving means in response to a difference between the detection sensitivities on the magneto-sensitive bodies constituting the two magneto-impedance elements.

The differential type magnetic sensor on a third aspect described in claim 3 of the present invention according to the first aspect of the present invention, comprises the signal adjusting means which is configured to adjust gains of signal processing means, which connect to the two magneto-impedance elements and constitute the magnetic detecting means, in response to a difference between the detection sensitivities on the magneto-sensitive bodies constituting the two magneto-impedance elements.

The differential type magnetic sensor of the first aspect of the present invention, having the above-described configuration, comprises a driving means for outputting driving currents, two magnetic detecting means including two magneto-impedance elements comprising two magneto-sensitive bodies which are disposed at two distant points and wherein the magnetic field signal voltages are generated in response to two external magnetic fields intensities around the two magneto-sensitive bodies to which the driving currents are applied and a differential operating means for operating a difference signal voltage between the two magnetic field signal voltages output from the magnetic detecting means and for outputting the difference signal between the two external magnetic field intensities, and the signal adjusting means which is interposed between the driving means and the differential operating means adjusts the output signals of the two magnetic detecting means in order that the two magnetic detecting means including the two magneto-impedance elements having different detection sensitivities output the two magnetic field signal voltages of same level in case of same intensities on the two external magnetic field intensities and outputs the output signals such that the detection sensitivities of the magnetic detecting means are considered to be roughly the same as each other and attains the effects of making it possible to delete the background magnetic field components common to the two points and thereby accurately detect a local weak magnetic field.

The differential type magnetic sensor of the second aspect of the present invention, having the above-described configuration, comprises the signal adjusting means which is configured to adjust the driving current supplied from the driving means in response to a difference between the detection sensitivities on the magneto-sensitive bodies constituting the two magneto-impedance elements, therefore, even if the detection sensitivities on the two magneto-impedance elements are different, when magnetic field signal voltages in response to the external magnetic field intensities around the amorphous wire are output, the magnetic field signal voltages are output after being adjusted such that the detection sensitivities are substantially equal to each other, and attains the effects of making it possible to delete the background magnetic field components common to the two points and thereby accurately detect a local weak magnetic field.

The differential type magnetic sensor on a third aspect described in claim 3 of the present invention according to the first, aspect of the present invention, comprises the signal adjusting means which is configured to adjust gains of signal processing means, which connect to the two magneto-impedance elements and constitute the magnetic detecting means, in response to a difference between the detection sensitivities on the magneto-sensitive bodies constituting the two magneto-impedance elements therefore, even when the two magneto-impedance elements whose detection sensitivities are different are used, it is possible to adjust the gains of the signal processing means before the input to the differential operating means such that the sensitivities are substantially equal to each other and attains the effects of making it possible to delete the background magnetic field components common to the two points and thereby accurately detect a local weak magnetic field.

DESCRIPTION OP THE PREFERRED EMBODIMENTS

Hereinafter, a best mode of the present invention will be described based on embodiments and examples with reference to the drawings.

Embodiment 1

Figure 1:
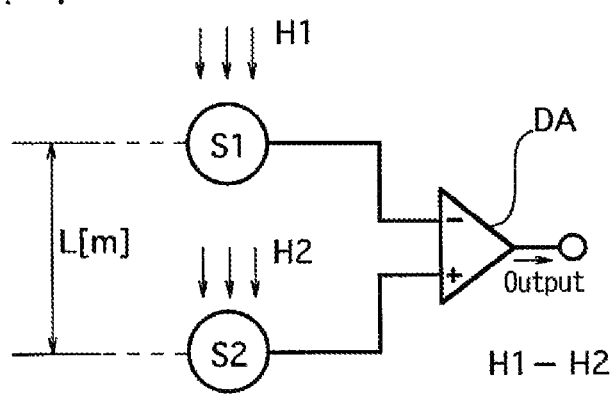
FIG. 1 is a block circuit diagram showing a basic configuration of a conventional differential magnetic sensor.
Figure 2:
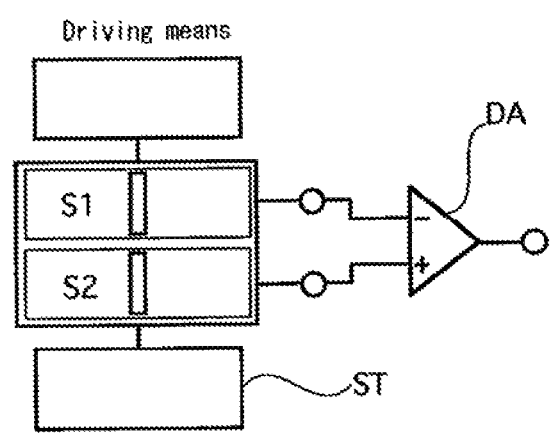
FIG. 2 is a main portion block circuit diagram showing a main portion of a differential magnetic sensor of a first embodiment of the present invention.

A differential type magnetic sensor of a first embodiment comprises, as shown in FIG. 2, two magnetic detecting means S1 and S2 including magneto-impedance elements having amorphous wires serving as two magneto-sensitive bodies and a differential operating means DA, and in the differential type magnetic sensor which outputs a signal of a difference between magnetic fields at two different points, a signal adjusting means ST is provided which adjusts the output signal such that when the external magnetic field intensities are equal, magnetic field signal voltages of the same magnitude axe output between the magnetic detecting means S1 and S2 and the differential operating means DA in response to a difference between the detection sensitivities on the amorphous wires of the two magneto-impedance elements.

In the differential type magnetic sensor of the first embodiment configured as described above, since the signal adjusting means ST adjusts the signal in response to the detection sensitivities on the two magneto-impedance elements, even if a difference is present between the detection sensitivities on the two magneto-impedance elements, the signal voltage is adjusted such that when the external magnetic field intensities around the two magneto-impedance elements are equal, the magnetic field signal voltages of the same magnitude can be regarded as being output. Therefore, the effect is obtained in which the background magnetic field components common to the two points are cancelled out by the differential operating means DA, and it is made possible to detect a local weak magnetic field.

Embodiment 2

Figure 3:
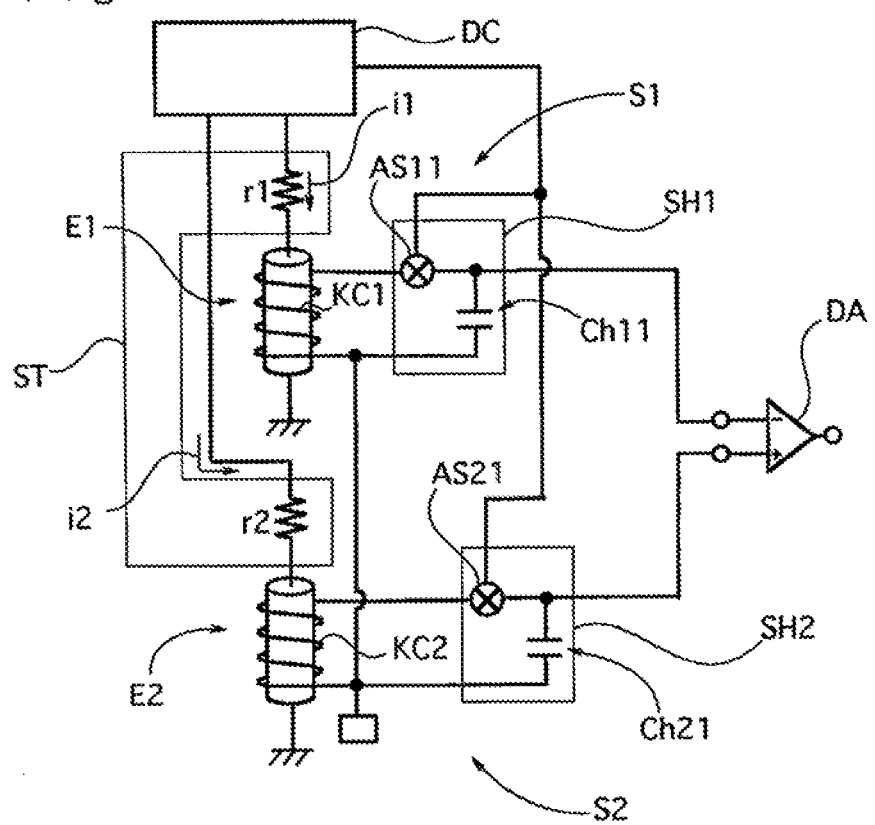
FIG. 3 is a circuit diagram showing a main portion of a differential magnetic sensor of a second embodiment of the present invention.

In a differential type magnetic sensor of a second embodiment, according to the first embodiment, as shown in FIG. 3, the two magneto-impedance sensors S1 and S3 include the magneto-impedance elements E1 and E2 formed with the amorphous wires and a driving circuit DC for outputting a pulse current, and resistance circuits r1 and r2 serving as the signal adjusting means ST are inserted between the magneto-impedance elements E1 and E2 and the driving circuit DC such that the products of the detection sensitivities or the magneto-impedance elements E1 and E2 and the driving currents applied to the respective magneto-impedance elements are substantially equal to each other.

In the differential type magnetic sensor of the second embodiment configured as described above, since the resistance values of the resistance circuits r1 and r2 inserted into the driving circuit DC are set such that a driving current in response to a ratio of the detection sensitivities on the two magneto-impedance elements E1 and E2 is applied, the effect is obtained in which an alternating-current voltage in response to the external magnetic field intensities around the two magneto-impedance elements E1 and E2 is output through detection coils KC1 and KC2 and is converted into a magnetic field signal with sample-hold circuits SH1 and SH2 which are operated by the other pulse output of the driving circuit DC and which are formed with analog switches AS11 and AS21 and capacitors Ch11 and Ch21 and the background magnetic field components common to the two points are cancelled out by the differential operating means DA, and it is made possible to accurately detect a local weak magnetic field based on minute iron powder or the like.

Embodiment 3

Figure 4:
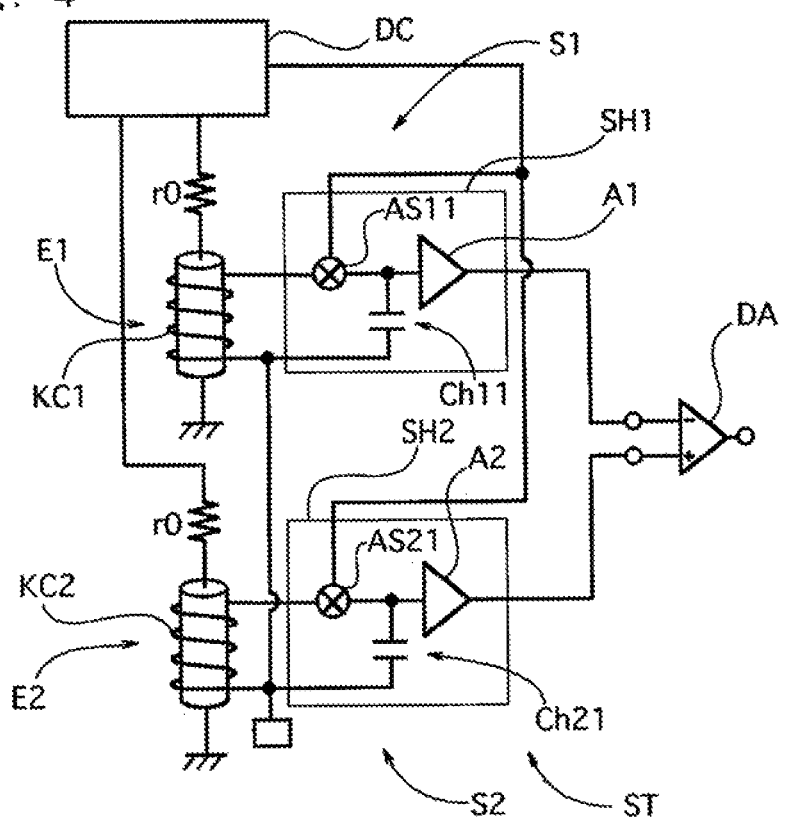
FIG. 4 is a circuit diagram showing a main portion of the differential magnetic sensor of a third embodiment of the present invention.

In a differential type magnetic sensor of a third embodiment, as shown in FIG. 4, the two magneto-impedance sensors S1 and S2 include the sample-hold circuits SH1 and SH2 including amplification circuits A1 and A2, a resistance circuit (unillustrated) is inserted as the signal adjusting means ST such that the products of the detection sensitivities on the magneto-impedance elements E1 and E2 formed with the respective magneto-sensitive bodies and the gains of the sample-hold circuits SH1 and SH2 serving as the signal processing means connected to the respective magneto-impedance elements are substantially equal to each other and thus the amplification degrees of the amplification circuits A1 and A2 in the sample-hold circuits SH1 and SH2 are set.

In the differential type magnetic sensor of the third embodiment configured as described above, since the amplification degrees of the amplification circuits A1 and A2 in the sample-hold circuits SH1 and SH2 are set in response to a ratio of the detection sensitivities on the two magneto-impedance elements E1 and S2, the effect is obtained in which, when the external magnetic field intensities a round the two magneto-impedance elements E1 and E2 are equal, the adjustment is performed such that amplification outputs based on the corresponding magnetic field signal voltages can be regarded as being the same values, are output to the differential operating means DA and thus the background magnetic field components common to the two points are cancelled out by the operation of the differential operating means DA, and it is made possible to accurately detect a local weak magnetic field based on minute iron powder or the like.

Example 1

A differential type magnetic sensor of a first example is a differential type magnetic sensor in which driving currents passed through two amorphous wires are adjusted in response to detection sensitivities such that the sensitivities are made equal to each other, a differential type magnetic sensor for measuring a difference between external magnetic field intensities H1 and H2 at certain two points, that is, a difference (H1−H2) between the magnetic fields, that is, a high-sensitivity magnetic gradiometer is established, and the first example is based on the first invention and the second invention.

Figure 5:
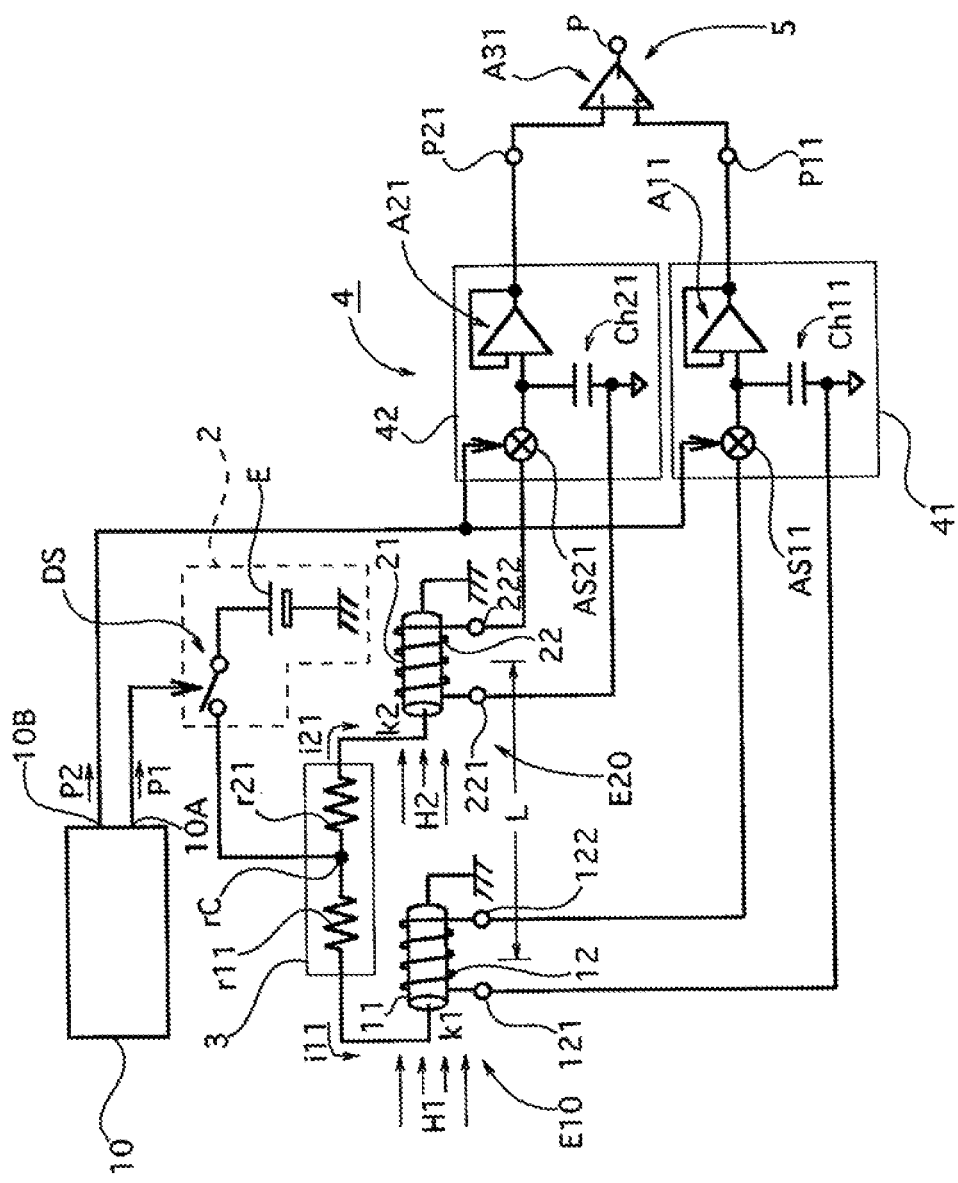
FIG. 5 is a detailed circuit diagram showing the details of a differential magnetic sensor of a first example of the present invention.

As shown in FIG. 5, the differential type magnetic sensor of the first example comprises first and second amorphous wires 11 and 21 serving as magneto-sensitive bodies around which detection coils 12 and 22 are wound, a pulse oscillation circuit 10 which outputs two pulses P1 and P2, a driving circuit 2 which outputs driving currents for driving the first and second amorphous wires 11 and 21 forming two magneto-impedance elements E10 and E20, a signal adjusting circuit 3 which adjusts the driving currents in response to the detection sensitivities on the first and second amorphous wires 11 and 21, a signal processing means 4 which comprises first and second sample-hold circuits 41 and 42 for holding external magnetic field signals output by the first and second detection coils 21 and 22, and a differential operating means 5 which operates a difference (H1–H2) between the external magnetic fields.

The two magneto-impedance elements E10 and E20 comprised the amorphous wires 11 and 21 constituting the magneto-sensitive bodies are, as shown in FIG. 5, arranged only a distance L away from each other. Although L is normally required to set within a range of about 0.01 to 10 m in many cases, other ranges are also required in other cases.

The amorphous wire 11 is made of a FeCoSiB-based alloy having an outside diameter of 10 μm and a length of 6 mm and is disposed at a certain point on which the external magnetic field H1 acts, one end is connected to one end of one resistor r11 of two resistors r11 and r21 described later and connected in series, the other end is grounded and the detection coil 12 is wound therearound.

The amorphous wire 21 is made of a FeCoSiB-based alloy having an outside diameter of 10 μm and a length of 6 mm and is disposed at a point which is L meters (m) away from the certain point and on which the external magnetic field H2 acts, one end is connected to one end of the other resistor r21 of the two resistors r11 and r21 described later and connected in series, the other end is grounded and the detection coil 22 is wound therearound.

The pulse oscillation circuit 10 (its detail view is omitted) comprises two logic elements connected in series, a resistor, and a capacitor, and includes a first output end 10A for outputting the pulse output P1 having a certain pulse width and a second output end 10B for outputting, in synchronization, the pulse P2 having a pulse width narrower than the pulse output P1.

The driving circuit 2 comprises a voltage source E which outputs a predetermined direct current, and an electronic switch DS whose one end is connected to the positive end of the voltage source E and which performs control so as to supply the direct current output from the voltage source E when the pulse P1 from the pulse oscillation circuit 11 is output to a control end.

The signal adjusting circuit 3 comprises the first and second resistors r11 and r21 connected in series, and it is configured such that, a connection point rc between the first resistor r11 and the second resistor r21 is connected to the other end of the electronic switch DS in the driving circuit 2 and the direct current from the voltage source E is supplied to the connection point while the pulse output P1 is applied to the control end of the electronic switch DS.

The first detection coil 12 is configured such that, one end 121 is connected to a direct-current power supply (unillustrated) of a predetermined direct-current potential, the other end 122 is connected to the analog switch AS11 in the sample-hold circuit 41, and an alternating-current voltage in response to the external magnetic field H1 in the surroundings where the amorphous wire 11 is placed is generated between both ends thereof and is output.

The second detection coil 22 is configured such that, one end 221 is connected to a direct-current power supply (unillustrated) of a predetermined direct-current potential, the other end 222 is connected to the analog switch AS21 in the sample-hold circuit, and an alternating-current voltage in response to the external magnetic field H2 in the surroundings where the amorphous wire 21 is placed is generated between both the ends 221 and 222 and is output when the driving current is applied through the second resistor r21 of the signal adjusting circuit 3 to the amorphous wire 21.

As shown in FIG. 5, the signal processing means 4 comprises first sample-hold circuit 41 connected to the first detection coil and the second sample-hold circuit 42 connected to the second detection coil.

The first sample-hold circuit 41 comprises the first analog switch AS11 whose one end is connected to the other end 122 of the first detection coil 12 and whose control end is connected to the second output end 10B of the pulse oscillation circuit 10, and the hold capacitor Ch11 whose one end is connected to the other end of the first analog switch AS11 and whose other end is connected to the direct-current power supply (unillustrated), and includes a first buffer amplifier A11 which is connected to the other end of the analog switch AS11 and which amplifies and outputs a voltage in response to the magnetic field H1 held.

The second sample-hold circuit 42 comprises the second analog switch AS21 whose one end is connected to the other end 222 of the second detection coil 22 and whose control end is connected to the second output end 10B of the pulse oscillation circuit 10, and the hold capacitor Ch21 whose one end is connected to the other end of the second analog switch AS21 and whose other end is connected to the direct-current power supply (unillustrated), and includes a second buffer amplifier A21 which is connected to the other end of the analog switch AS21 and which amplifies and outputs a voltage in response to the magnetic field H2 held.

The differential operating means 5 comprises a differential amplifier A31 whose positive input end is connected to the output end P11 of the first buffer amplifier A11, whose negative input end is connected to the output end P21 of the second buffer amplifier A21, and which outputs a difference voltage between output voltages from the first and second buffer amplifier circuits A11 and A21.

A description will be given of the adjustment of the detection sensitivities on the two magneto-impedance sensors in the differential type magnetic sensor of the first example configured as described above.

Since in each of the magneto-impedance elements E10 and E20 formed with the amorphous wires 11 and 21 and the detection coils 12 and 22, variations are occurred in the manufacturing process, when they are assembled as the magneto-impedance elements, there is a possibility that a difference is arisen between the detection sensitivities with respect to each other.

For example, when it is assumed that the detection sensitivities as the magneto-impedance elements when the predetermined same pulse currents are passed through the amorphous wires 11 and 21 based on the pulse P1 are k1 and k2, in a case where a difference between the sensitivities on both the elements is present, as indicated by formula 1 below, the detection sensitivities k1 and k2 normally do not result in the same values.

$$k1 \ne k2 \qquad \text{(Formula 1)}$$

Therefore, when it is assumed that the gains of the buffer amplifiers A11 and A21 are 1 when the two magneto-impedance elements are placed in the magnetic field environment H0 serving as the same standards, the respective outputs H0×k1 and H0×k2 of the output terminals P11 and P21 do not result in the same outputs as indicated by formula 2 below. Although a difference between detection sensitivities caused by variations in the manufacturing is often small, and thus a large difference is unlikely to be produced, as in the application described previously, for example, in a case where the magnetic field of significantly minute iron powder on the level of several nT is to be measured, such a difference between the detection sensitivities causes a crucial decrease in the accuracy.

$$H0 \times k1 \neq H0 \times k2 \qquad \text{(Formula 2)}$$

That is, since the output terminals P11 and P21 also serve as the input terminals of the differential amplifier A31 serving as the differential operating means 5, it means that the outputs of the two magnetic detecting means at the input terminals of the differential operating means 5 are different, and thus the differential type magnetic sensor which allows the accurate detection of the magnetic field is not achieved, with the result that it is necessary to adjust the detection sensitivities.

Since the detection sensitivities k1 and k2 of the two magneto-impedance elements are substantially proportional to the magnitude of the current which is flowed through the amorphous wires 11 and 21 based on the pulse P1 by the driving circuit 2, it is possible to adjust the detection sensitivities as the magneto-impedance elements by adjusting the current flowed through the two amorphous wires 11 and 21.

That is, in order to make the detection sensitivities on the two magnetic detecting means equal to each other, it can be achieved either by flowing a larger pulse current through the amorphous wire of the magneto-impedance element whose detection sensitivity is lower or by reducing a pulse current through the amorphous wire whose detection sensitivity is higher.

That is, the pulse currents flowed through the respective amorphous wires 11 and 12 are set to pulse currents i11 and i21 so as to establish a relationship indicated by formula 3 below, and thus it is possible to make the detection sensitivities on the two magneto-impedance elements substantially equal to each other.

$$H0 \times k1 \times i11 = H0 \times k2 \times i21 \qquad \text{(Formula 3)}$$

By organizing the above formulas, the formula as indicated by formula 4 below results. That is, the technical principle for making the products of the detection sensitivities on the two magneto-impedance elements and the driving currents of the respective magneto-impedance elements substantially equal to each other, and thereby making the detection sensitivities substantially equal to each other.

$$k1 \times i11 = k2 \times i21 \qquad \text{(Formula 4)}$$

When it is assumed that the resistance values of the two amorphous wires are w11 and w21 and that the voltage of a power supply E for the driving circuit 2 is Ed, the pulse currents i11 and i21 flowed through the two amorphous wires 11 and 12 are as indicated by formulas 5 and 6 below. The following description of r21 and r22 and the like for the explanation of the resistors are described to mean both the symbols and the resistance values of the resistors.

$$i11 = Ed/(r11+w11) \qquad \text{(Formula 5)}$$

$$i21 = Ed/(r21+w21) \qquad \text{(Formula 6)}$$

When above formulas 5 and 6 are applied to above formula 4, formula 7 below can be obtained.

$$r21 = k2/k1(r11+w11) - w21 \qquad \text{(Formula 7)}$$

That is, the driving current may be adjusted by determining the resistor r11 which has such a resistance value that can apply a driving current for providing the desired detection sensitivity to one of the magneto-impedance elements, determining the resistance value of the resistor r21 for obtaining the same sensitivity for the other magneto-impedance element by formula 7 above, and by inserting a resistance circuit formed with the resistors r11 and r21 as the signal adjusting means 3 to the driving circuit 2. In this way, it is possible to perform the adjustment such that the total detection sensitivities on the two magnetic detecting means can be regarded as being substantially equal to each other.

The differential type magnetic sensor of the first example which is configured as described above and on which the adjustment is performed, comprises the two magneto-impedance sensors serving as the two magnetic detecting means and one differential operating means, and the respective magneto-impedance sensors include the pulse oscillation circuit 10 and the amorphous wire driving circuit 2 which are common and are used for performing pulse driving on the respective amorphous wires 11 and 21.

That is, the pulse oscillation circuit 10 outputs, from the two output ends 10A and 10B, the pulses P1 and P2 which are in synchronization with each other and have a predetermined period.

In the driving circuit 2, the control terminal of the electronic switch DS is connected to the output end 10A for outputting the pulse P1 of the pulse oscillation circuit 10, and open/close control is performed on the connection point. One connection point electrode of the electronic switch DS is connected to the voltage source E, the other connection point electrode is connected to each of the resistors r11 and r21 which are connected in series to the amorphous wires 11 and 21 and thus the pulse currents i11 and i21 are respectively flowed through the amorphous wires 11 and 21 in response to the turning on and off of the pulse P1.

By the pulse currents, the amorphous wires 11 and 21 realize about a magnetic impedance effect, and alternating-current voltages in response to the external magnetic fields H1 and H2 in the surroundings where the respective amorphous wires 11 and 21 are placed are generated between the respective terminals of the detection coils 12 and 22.

The alternating-current voltages are respectively sampled based on the pulse P2 with predetermined timing by use of the two sample-hold circuits 41 and 42 comprising the analog switches AS11 and AS21, the hold capacitors Ch11 and Ch21, and the buffer amplifiers A11 and A21, are held as voltages in the hold capacitors Ch11 and Ch21, and are output from the buffer amplifiers A11 and A21.

The outputs from the respective output terminals P11 and P21 of the buffer amplifiers A11 and A21 are adjusted such that the outputs are in response to the magnetic fields H1 and H2 and such that the both detection sensitivities thereof can be regarded as being the same.

Therefore, since it is possible to adjust the outputs such that the detection sensitivities on the two magnetic detecting means are made equal to each other as much as possible before inputting the outputs to the differential amplifier A31 constituting the differential operating means 5, the differential type magnetic sensor of the first example attains operations and effects of making it possible to inexpensively detect a weak magnetic field of minute iron powder or the like with high sensitivity and high precision in which the process for searching for a combination of magneto-impedance elements having the same sensitivities as conventionally performed is no longer necessary and all magneto-impedance elements which are produced are effectively used, and making it possible to realize a differential type magnetic sensor with high sensitivity and high precision.

Example 2

Figure 6:
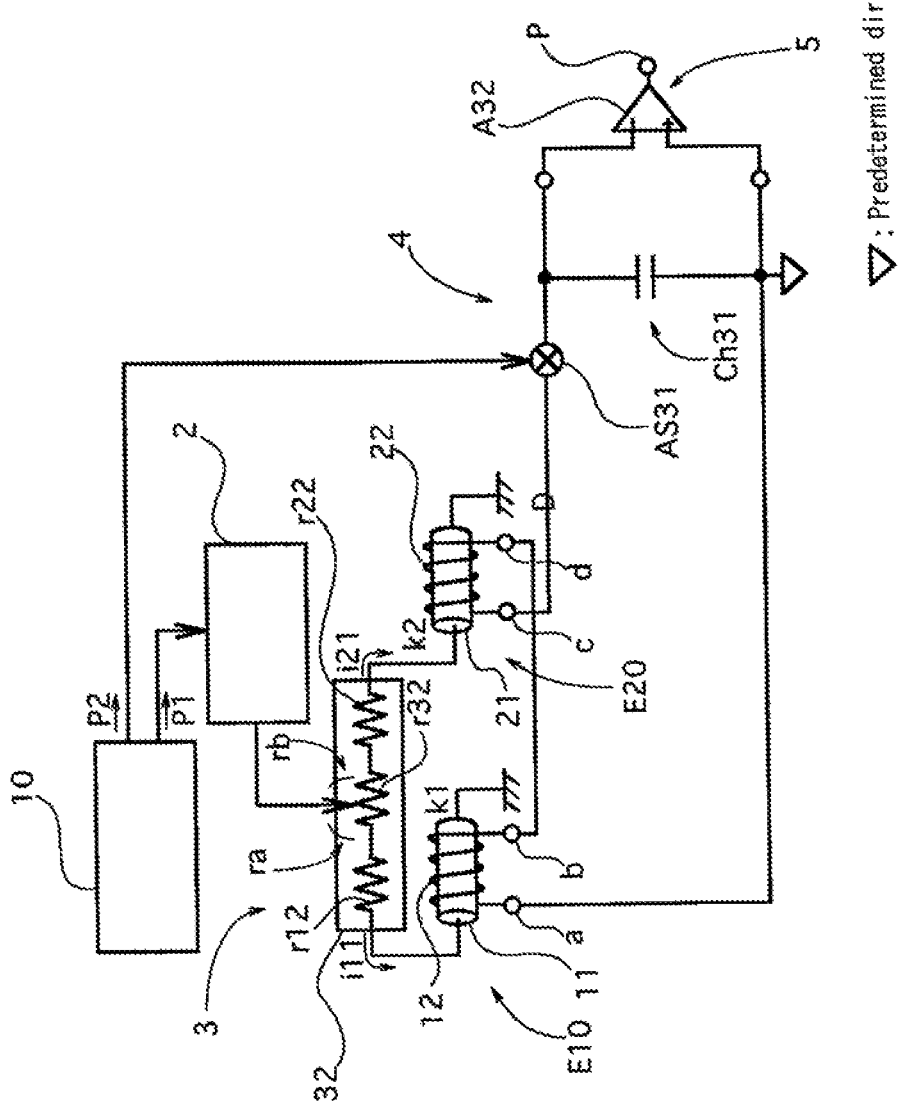
FIG. 6 is a detailed circuit diagram showing the details of a differential magnetic sensor of a second example of the present invention.

In a differential type magnetic sensor of a second example, as shown in FIG. 6, a variable resistor r32 is added to the signal adjusting means 3 in the differential type magnetic sensor of the first example described above, and differences will be mainly described below.

There is an example where in the signal adjusting means, a variable resistor is used in a process of selecting a resistor for performing current adjustment, and when it is assumed in the second example that the fixed resistors r12 and r22 have the same resistance values, that a resistance value between one electrode of the variable resistor r32 and a slider is ra and that a resistance value between the other electrode and the slider is rb, the pulse currents i11 and i21 can be set as indicated by formulas 8 and 9 below.

$$i11 = Ed/(r12+ra+w11) \quad \text{(Formula 8)}$$

$$i21 = Ed/(r22+rb+w21) \quad \text{(Formula 9)}$$

When above formulas 8 and 9 are applied to above formula 4, formula 10 below can be obtained.

$$rb = k2/k1(r11+ra+w11)-(r21+w21) \quad \text{(Formula 10)}$$

That is, as the signal adjusting means 3, between the driving circuit 2 and the amorphous wires 11 and 21, the resistance circuit 32 of the resistors r12, ra and r22, rb is disposed so as to be inserted, and thus it is possible to perform the adjustment such that the total detection sensitivities on the two magnetic detecting means can be regarded as being substantially equal to each other.

Since the resistance values ra and rb can be continuously set by the variable resistor r32 with high precision, the differential type magnetic sensor of the second example attains operations and effects of making it possible to significantly enhance the productivity of the process for making the sensitivities equal to each other as compared with a work for replacing the fixed resistors in the first example described above, and, even if the balance of the detection sensitivities is changed during the inspection, being capable of swiftly performing the adjustment so as to correspond to such change.

In the second example, in terms of simplifying the electronic circuit, the respective detection coils 12 and 22 of the magneto-impedance elements E10 and E20 are differentially connected, and thus the differential amplifier of the first example is omitted.

That is, in the differential type magnetic sensor of the second example, the winding end electrodes b and d of the respective detection coils 12 and 22 are connected to each other, a voltage between both the winding start electrodes a and c, that is, a difference voltage between the alternating-current voltages produced in the detection coils 12 and 22 is sampled and held by only one sample-hold circuit which is formed with an analog switch AS31 and the hold capacitor Ch31 and in which the buffer amplifier is omitted, thus a difference magnetic field signal between the two magnetic fields H1 and H2 is output from the output terminal of a high-input impedance amplifier A32 which is the differential operating means 5 also serving as the buffer amplifier, and thus the effect is obtained in which it is made possible to reduce cost and to accurately detect a weak magnetic field by simplifying the electronic circuit.

The differential type magnetic sensor of the second example configured as described above attains operations and effects of realizing a high-sensitivity differential type magnetic sensor more inexpensively, as the high-input impedance amplifier A32 can use a normal OP amplifier (operational amplifier) so as to realize a high-input impedance amplification circuit.

Example 3

A differential type magnetic sensor of a third example is an example based on the third invention in which the gains are adjusted in the sample-hold circuit of the signal processing means, and differences from the first example described above will be mainly described below.

Figure 7:
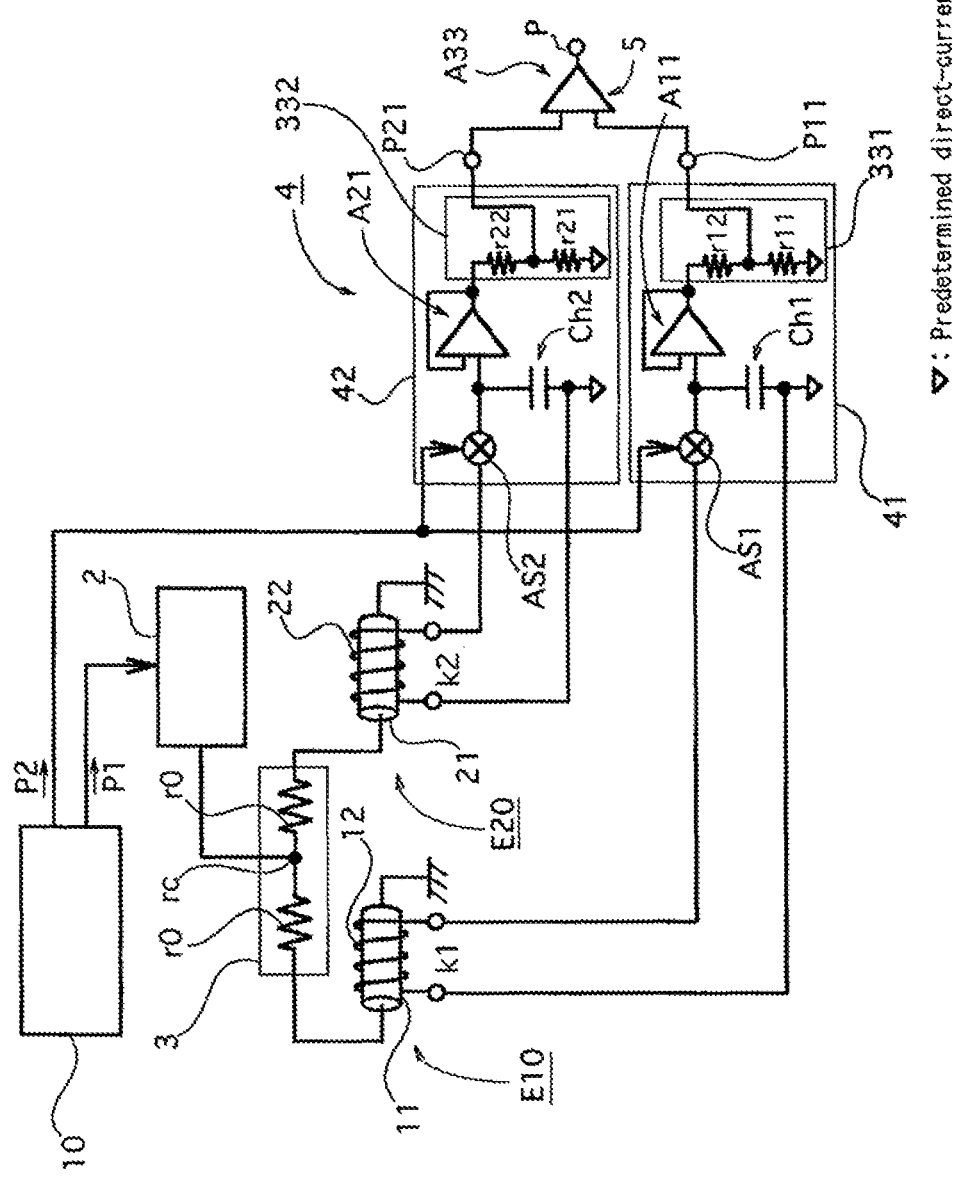
FIG. 7 is a detailed circuit diagram showing the details of a differential magnetic sensor of a third example of the present invention.

The differential type magnetic sensor of the third example differs from the first and second examples described above in that the sensitivities are not adjusted by the adjustment of the driving current passed through the amorphous wires and that as shown in FIG. 7, the two amorphous wires 11 and 21 are driven by the same pulse current via a resistor r0 of the same resistance value as with the conventional differential type magnetic sensor. Therefore, in a case where the detection sensitivities on the two magneto-impedance elements E10 and E20 differ from each other due to variations in the manufacturing process or the like, outputs from the two magneto-impedance elements differ from each other.

Therefore, in the third example, the adjustment of the detection sensitivities on the magneto-impedance elements is performed by inserting resistance circuits 331 and 332 serving as the signal adjusting means 3 into the sample-hold circuit serving as the signal processing means 4 and thereby adjusting an attenuation rate so as to obtain a gain of 1 or less.

More specifically, the first resistance circuit 331 which comprises the resistors r11 and r12 connected in series, whose one end is connected to a direct-current source (unillustrated), whose other end is connected to the output end of the follower A11 and in which the connection point of the resistors r11 and r12 is connected to the output terminal P11 and the second resistance circuit 332 which comprises the resistors r21 and r22 connected in series, whose one end is connected to a direct-current source (unillustrated), whose other end is connected to the output terminal of the follower A21 and in which the connection point of the resistors r21 and r22 is connected to the output terminal P21 are respectively inserted between the output terminals of followers A11 and A21 having an amplification degree of 1 produced by an OP amplifier serving as a buffer amplifier and the output terminals P11 and P21.

The attenuation rates of the first and second resistance circuits are:

$$r11/(r11+r12), \text{ and}$$

$$r21/(r21+r22).$$

Here, when it is assumed that the specific detection sensitivities on the two magneto-impedance elements E10 and E20 are k1 and k2, by setting the resistance values of the resistors r11, r12, r21, and r22 as indicated by formula 11 below, it is made possible to adjust the output signal such that the detection sensitivities on the two magneto-impedance elements can be regarded as being substantially equal to each other before inputting the output signal to a differential amplifier A33 constituting the differential operating means 5.

$$k1 \times r11/(r11+r12) = k2 \times r21/(r21+r22) \quad \text{(Formula 11)}$$

Specifically, it is as indicated by formula 12 below, and the resistance values of the resistors r11, r12, and r21 are previously determined, and the resistance value of the resistor r22 is calculated based on formula 12 below and is applied to the resistance circuits.

$$r22=(k2 \times r21)/(k1 \times r11) \times (r11+r12)-r21 \quad \text{(Formula 12)}$$

As an example, the resistors r11 and r21 are normally set to 1 kΩ or more such that they do not become a large load on buffer amplifiers A12 and A21, and the resistor r12 is set to, for example, 0.1 kΩ such that the attenuation rate to the resistor r11 is, for example, about 10%. This is because, since variations in the detection sensitivities on the magneto-impedance elements are several % or less at most, the calculation of the resistance value of the resistor r22 is allowed such that the signal adjustment can be performed on any variation within this range.

As the resistors r11, r12, r21, and r22, a variable resistor can also be adopted.

The differential type magnetic sensor of the third example configured as described above attains operations and effects of making it possible to accurately detect a local weak magnetic field based on minute iron powder or the like to be detected by canceling out the background magnetic field components common to the two points, since it is possible to adjust the output signal input to the differential amplifier A33 constituting the differential operating means 5 such that the final detection sensitivities on the signal adjusting means can be regarded as being substantially equal to each other, even in a case where the detection sensitivities on the two magneto-impedance elements differ from each other due to variations in the manufacturing or the like, by the first and second resistance circuits 331 and 332 which are inserted into the sample-hold circuits 41 and 42 and which serve as the signal adjusting means.

Example 4

Figure 8:
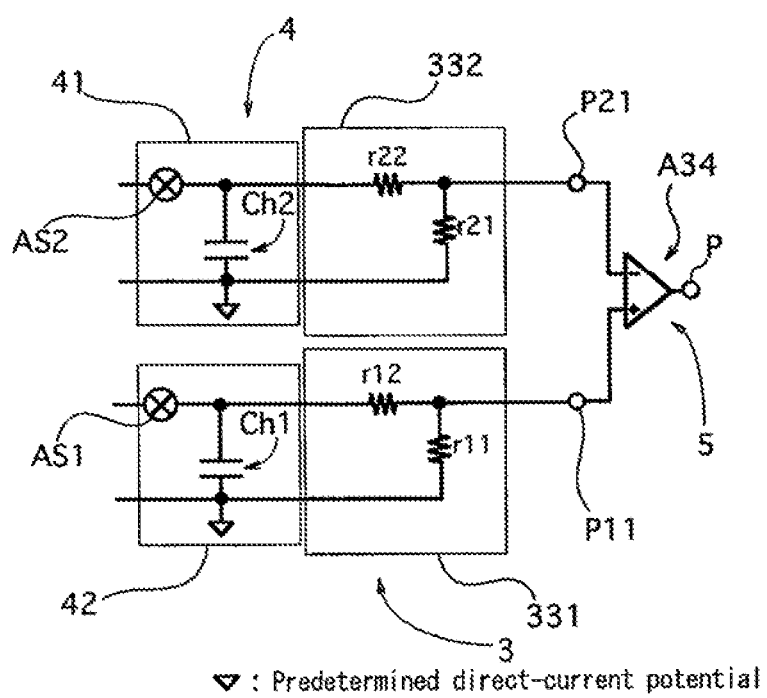
FIG. 8 is a partial detailed circuit diagram showing the details of a differential magnetic sensor of a fourth example of the present invention.

In a differential type magnetic sensor of a fourth example, in order to realize a low price, as a main portion is shown in FIG. 8, as a means corresponding to the differential operating means 5 in the third example described above, a high-input impedance differential amplifier A34 is used, and the buffer amplifiers A11 and A21 of the sample-hold circuits 41 and 42 serving as the signal processing means 4 are omitted, and differences will be mainly described below.

Between the hold capacitors Ch1 and Ch2 of the sample-hold circuits 41 and 42 and the input terminals P11 and P21 of the high-input impedance differential amplifier A34 serving as the differential operating means 5, an attenuation circuit is inserted which is the resistance circuits 331 and 332 formed with the resistors r11 and r12 and the resistors r21 and r22 inserted as the signal adjusting means 3.

Here, conditions in which the detection sensitivities on the two magneto-impedance elements are made equal to each other are the same as shown in FIG. 7, and r22 is calculated based on formula 12 which has already been described.

Here, discharge time constants t1 and t2 which are determined by the products of the resistors r11 and r21 and the hold capacitors Ch1 and Ch2 of the sample-hold circuits 41 and 42 are as indicated by formulas 13 and 14 below.

$$t1=(r11+r12) \times Ch1 \approx r11 \times Ch1 \because r11 \gg r12 \quad \text{(Formula 13)}$$

$$t2=(r21+r22) \times Ch2 \approx r21 \times Ch2 \because r21 \gg r22 \quad \text{(Formula 14)}$$

When it is assumed that the period of the pulses P1 and P2 output from the pulse oscillation circuit 10 is T, the updating of magnetic signals by the sample-hold circuits 41 and 42 is also performed by the period T.

When the discharge time constants t1 and t2 are equal to or larger than the period T, that is, when the discharge time constants t1 and t2 satisfy formula 15 below, the voltage of the hold capacitor which is sampled and held, that is, the magnetic field signal which is detected can be held with a predetermined degree of accuracy until the timing at which the subsequent new sampling and holding is performed.

$$t1, t2 \geq T \quad \text{(Formula 15)}$$

In this case, when the input impedance of the differential amplifier A34 is sufficiently higher than the resistors r11 and r21, the buffer amplifiers A11 and A21 shown in FIG. 7 can be omitted.

In the fourth example, the repetition period T of the pulses P1 and 92 is set to 1 μs (microsecond), the resistors r11 and r21 in the attenuation circuit constituted by the resistance circuits 331 and 332 are set to, for example, 300 kΩ, and the capacitors Ch1 and Ch2 are set to 100 pF (picofarads).

The discharge time constants t1 and t2 in this case are as indicated by formulas 16 and 17 below.

$$t1=r11 \times C1=300 \times 10^3 \times 100 \times 10^{-12}=30 \times 10^{-6}=30 \ \mu s \quad \text{(Formula 16)}$$

$$t2=r21 \times Ch2=300 \times 10^3 \times 100 \times 10^{-12}=30 \times 10^{-6}=30 \ \mu s \quad \text{(Formula 17)}$$

Therefore, both the discharge time constants t1 and t2 are sufficiently larger than the period T=1 μs of the pulses P1 and P2, formula 15 above holds true and the input impedance of a normal high-input impedance amplifier is high enough to disregard as compared with 300 kΩ which is used for the resistors r11 and r21, therefore, the buffer amplifier can be omitted as described previously.

It is as described previously, with the attenuation circuit which serves as the signal adjusting means 3 and which is the resistance circuits 331 and 332 formed with the resistors r11 and r12 and the resistors r21 and r22, it is possible to highly accurately adjust the sensitivities on the two signal detecting means.

As is clear from what has been described above, the differential type magnetic sensor of the fourth example attains operations and effects of being capable of realizing a further reduction in cost, since it is not necessary to use the follower circuit of the OP amplifier serving as the buffer amplifier in the above-described third example.

As in the third example, as the resistors r11, r12, r21, and r22, a variable resistor can be adopted.

Example 5

Figure 9:
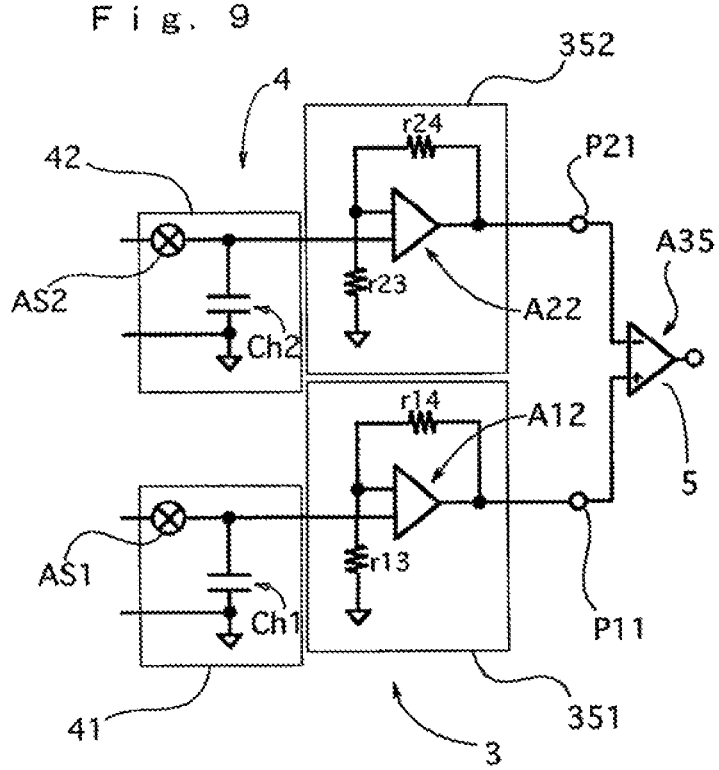
FIG. 9 is a partial detailed circuit diagram showing the details of a differential magnetic sensor of a fifth example of the present invention.

In the differential type magnetic sensor of a fifth example, as shown in FIG. 9, the buffer amplifiers A12 and A22 of the sample-hold circuits 41 and 42 serving as the signal adjusting means 3 are realized by non-inverting amplifiers formed with an OP amplifier and resistance circuits 351 and 352, and an output is provided to a differential operating unit A35.

The gains of the two non-inverting amplifiers serving as the buffer amplifiers formed with the OP (operational) amplifier A12, resistors r13 and r14, an OP (operational) amplifier A22 and the resistors r23 and r24 can be set as follows.

$$(1+r14/r13)$$

$$(1+r24/r23)$$

Therefore, when it is assumed that the specific sensitivities on the two magneto-impedance elements are k1 and k2, by setting the resistance values of the resistors r13, r14, r23, and r24 as indicated toy formula 18 below, it is made possible to perform the adjustment such that the detection sensitivities on the two magneto-impedance elements are substantially equal to each other before the input to the differential operating means A35.

$$k1 \times (1+r14/r13) = k2 \times (1+r24/r23) \quad \text{(Formula 18)}$$

Specifically, one of the magneto-impedance elements is set to the desired detection sensitivity by the setting of the resistance values of the resistors r13 and r14, and as the detection sensitivity on the other magneto-impedance element, r24, which is calculated by formula 19 where resistor r23=resistor r13 is applied.

$$r24 = r23/k2 \times (k2-k1-k1 \times r14/r13) \quad \text{(Formula 19)}$$

The resistors r13, r14, r23, and r24 can be constituted by a variable resistor.

Since the buffer amplifiers A12 and A22 of the sample-hold circuits 41 and 42 serving as the signal adjusting means 3 are realized, by the non-inverting amplifiers formed with the OP amplifier and the resistance circuits 351 and 352, and the output is provided to the differential operating unit A35, the differential type magnetic sensor of the fifth example configured as described above attains operations and effects that make if possible to realize a higher-sensitivity differential type magnetic sensor, as it is passible to obtain the output voltage such that, by setting the resistance values of the resistance circuits 351 and 352, the final detection sensitivities on the magnetic detecting means can be regarded as being substantially equal to each other while the amplification is performed with a gain of 1 or more.

An example of measurement in which the actual magnetic field measurement was performed with the differential type magnetic sensor of the fifth example will be described below with reference to FIG. 10(A).

That is, the distance between the two magneto-impedance elements of the two magnetic detecting means was set to 30 mm, one of them was disposed in an upper portion near the passage of iron powder having a diameter of 0.3 mm which was passed by a belt conveyor, the other is disposed so as to be displaced upward with respect thereto and the measurement was performed.

Figure 10:
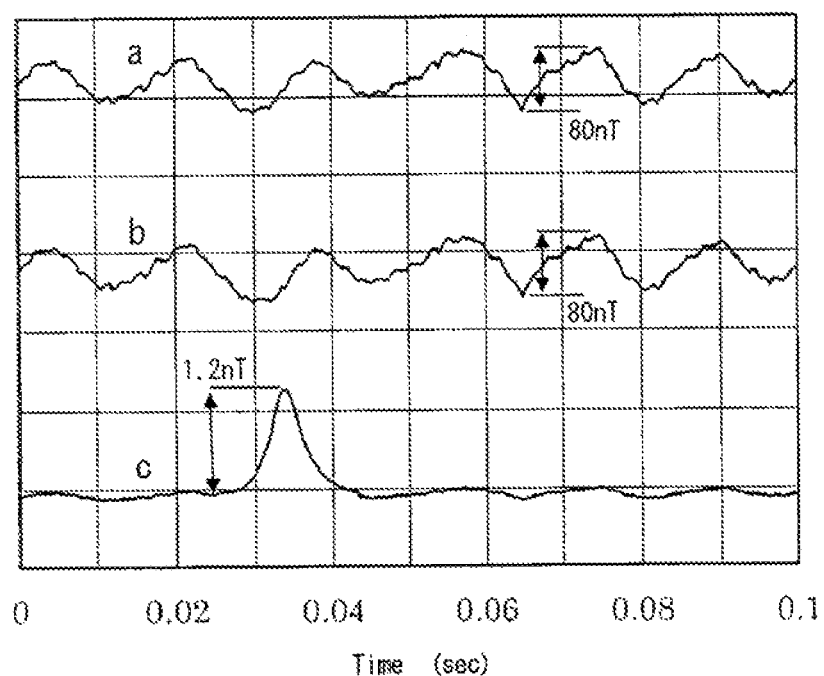
FIG. 10 is a diagrammatic view showing the examples measured by a differential magnetic sensor of a fifth example of the present invention and showing the examples measured not being applied a signal adjustment means of a comparative example of the present invention.
Figure 10:
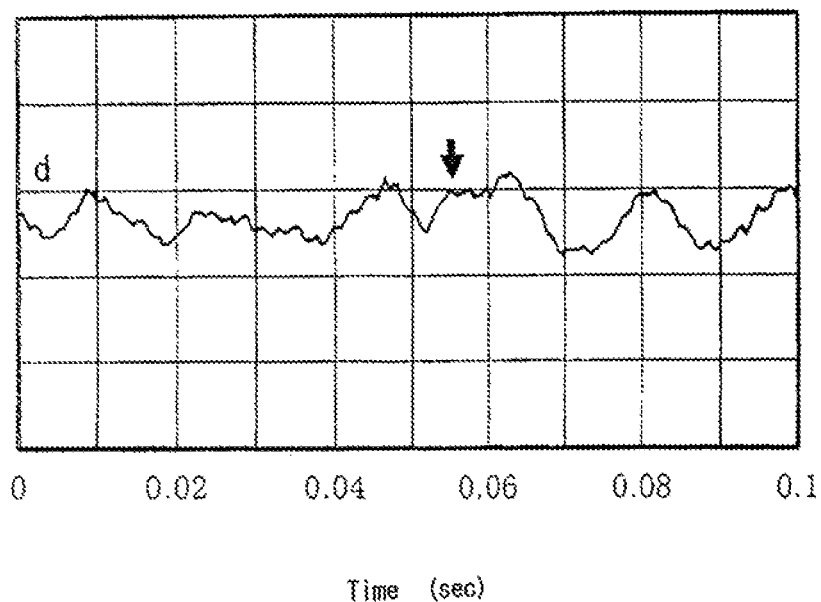

In FIG. 10(A) indicating the results of the measurement described above, a and b show waveforms output from the output terminals P11 and P21 of the respective magnetic detecting means. a and b show substantially equivalent waveforms, and they are displayed by being displaced vertically in FIG. 10(A) in order to make it easy to see the waveforms.

Although the waveform a contains a weak magnetic signal caused by passing of the iron powder, since background magnetic field components causing a noise are about 80 nT at the maximum both in the waveforms a and b, and, as if is, the magnetic signal at the time of passing of the minute iron powder is hidden by the background magnetic field components, with the result that it cannot be clearly visually recognized. Here, c indicates an output of the differential operation of the differential operating unit A35, the background noises of both outputs were reduced to about $1/400$ by a differential operation effect and a magnetic field fluctuation waveform caused by passing of the iron powder whose peak value was 1.2 nT was observed. The waveform c was displayed by enlarging the scale of the vertical axis as compared with a and b in order to make it easy to see the magnetic field fluctuation.

In the measurement experiment described above, with consideration given to the fact that geomagnetism is a direct-current magnetic field, a filter for removing low-frequency waves was used, and thus the experiment was performed such that the results of the measurement were not influenced fey low-frequency waves.

A waveform d shown in FIG. 10(B) is an output waveform after a differential operation in a comparative example where the same measurement as described above was performed without application of the signal adjusting means which is the feature of the fifth example. It is an example in which a background noise was not sufficiently reduced in this case, and thus a waveform which could otherwise be seen in a position indicated by an arrow and which was caused by passing of the iron powder was hidden.

The preferred embodiments of the present invention, as herein disclosed, are taken as some embodiments for explaining the present invention. It is to be understood that the present invention should not be restricted by these embodiments and any modifications and additions are possible so far as they are not beyond the technical idea or principle based on descriptions of the scope of the patent claims.

Although in the embodiments and examples discussed above, the cases where the amorphous wires are adopted as the magneto-sensitive bodies are described as an example, the present invention is not limited thereto, and as the magneto-sensitive bodies, thin films or the like can be adopted as necessary.

Although in the embodiments and examples discussed above, the examples where the external magnetic fields are detected by the detection coils wound around the amorphous wires serving as the magneto-sensitive bodies are described as an example, the present invention is not limited thereto, and it is possible to adopt an example where the external magnetic fields are detected by output voltages at both ends of the amorphous wires serving as the magneto-sensitive bodies.

Although in the embodiments and examples discussed above, the examples of the signal adjusting means which adjusts a signal such that when the external magnetic field intensities are equal, in response to a difference between the detection sensitivities on the two magneto-impedance elements, the magnetic field signal voltages whose magnitudes are the same are output are described as an example, the present invention is not limited thereto, and it is possible to adopt, as necessary, for example, a signal adjusting means for adjusting the signal so as to compensate for the difference between the detection sensitivities on the two magneto-impedance elements and thereby make the levels of the magnetic field signal voltages equal to each other, a signal adjusting means for adjusting the signal such that the magnetic field signal voltage is output which has a level where the total detection sensitivities on the two magnetic detecting means can be regarded as being equivalent to each other, and a signal adjusting means for adjusting the signal such that even when the detection sensitivities on the two magneto-impedance elements differ from each other, it is possible to assume that the final detection sensitivities on the two magnetic detecting means are equivalent to each other.

INDUSTRIAL APPLICABILITY

The present invention is suitable for applications such as weak magnetic detection in the field of physical and chemical research, measurement of geomagnetic or other very small fluctuations caused by volcanism or the like, and magnetic field detection at a plurality of points.

DESCRIPTION OF SYMBOLS 11, 21 amorphous wire
10 pulse oscillation circuit

2 driving circuit
3 signal adjusting means
5 differential operating weans
12, 22 detection coil
41, 42 sample-hold circuit

What is claimed is:

1. A differential type magnetic sensor comprising a driving means for outputting driving currents,
   two magnetic detecting means including two magneto-impedance elements comprising two magneto-sensitive bodies which are disposed at two distant points and wherein two magnetic field signal voltages are generated in response to two external magnetic fields intensities around said two magneto-sensitive bodies to which the driving currents are applied and
   a differential operating means for operating a difference signal voltage between the two magnetic field signal voltages output from said magnetic detecting means and for outputting the difference signal between the two external magnetic field intensities, and
   further comprising a signal adjusting means which is interposed between said driving means and said differential operating means and adjusts the output signals of said two magnetic detecting means in response to the different detection sensitivities of two magneto-impedance elements in order that said two magnetic detecting means including said two magneto-impedance elements having different detection sensitivities output the two magnetic field signal voltages of same level in case of same intensities on the two external magnetic field intensities around said two magneto-sensitive bodies, and wherein
   said differential type magnetic sensor is configured that a local weaker magnetic field than a background magnetic field component is detected by adjusting the two magnetic field signal voltages such that the detection sensitivities of the magnetic detecting means are regarded to be roughly the same as each other and canceling the background magnetic field components common to the two points.

2. The differential type magnetic sensor according to claim 1, wherein
   said signal adjusting means is configured to adjust the driving current supplied from said driving means in response to a difference between the detection sensitivities on said magneto-sensitive bodies constituting said two magneto-impedance elements.

3. The differential type magnetic sensor according to claim 1, wherein
   said signal adjusting means is configured to adjust gains of signal processing means, which connect to said two magneto-impedance elements and constitute said magnetic detecting means, in response to a difference between the detection sensitivities on said magneto-sensitive bodies constituting said two magneto-impedance elements.

* * * * *